United States Patent
Layadi et al.

(10) Patent No.: US 6,730,600 B2
(45) Date of Patent: May 4, 2004

(54) METHOD OF DRY ETCHING A SEMICONDUCTOR DEVICE IN THE ABSENCE OF A PLASMA

(75) Inventors: Nace Layadi, Singapore (SG); Simon John Molloy, Allentown, PA (US); Sailesh Mansinh Merchant, Orlando, FL (US); Isik C. Kizilyalli, Breinigsville, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/259,256

(22) Filed: Sep. 27, 2002

(65) Prior Publication Data

US 2004/0063315 A1 Apr. 1, 2004

(51) Int. Cl.[7] ............................................. H01L 21/465
(52) U.S. Cl. ..................................... 438/685; 438/706
(58) Field of Search ................................ 438/648, 656, 438/685, 706

(56) References Cited

U.S. PATENT DOCUMENTS

| | | | |
|---|---|---|---|
| 4,498,953 A | * | 2/1985 | Cook et al. .................. 438/738 |
| 5,913,148 A | | 6/1999 | Hills |
| 6,051,873 A | * | 4/2000 | Yoshihisa .................... 257/588 |
| 6,162,367 A | * | 12/2000 | Tai et al. ....................... 216/79 |
| 6,211,535 B1 | * | 4/2001 | Yamamoto et al. ........... 257/66 |
| 6,290,864 B1 | * | 9/2001 | Patel et al. .................... 216/79 |
| 6,500,356 B2 | * | 12/2002 | Goto et al. .................... 216/72 |
| 6,576,151 B1 | * | 6/2003 | Vereecke et al. .............. 216/63 |

OTHER PUBLICATIONS

D.E. Ibbotson et al., "Plasmaless Dry Etching of Silicon with Fluorine–Containing Compounds," J. Appl. Phys., vol. 56, Nov. 1984, pp. 2939–2942.*

* cited by examiner

Primary Examiner—Erik J. Kielin
Assistant Examiner—Stephen W. Smoot
(74) Attorney, Agent, or Firm—James H. Beusse; Beusse Brownlee Wolter Mora & Maire, P.A.

(57) ABSTRACT

A method for dry etching a material deposited on semiconductor device is performed by chemically reacting the material with an etchant gas. The etching process is conducted in a reaction chamber at a predetermined temperature and predetermined pressure within the reaction chamber and without the need of generating a plasma within the chamber or applying an electrical bias to the semiconductor device. A sufficient amount of gas is introduced into the reaction chamber to selectively remove the material from the semiconductor device.

15 Claims, No Drawings

METHOD OF DRY ETCHING A SEMICONDUCTOR DEVICE IN THE ABSENCE OF A PLASMA

The present invention pertains generally to the fabrication of semiconductor devices and more specifically to systems and methods for etching materials during formation of on the semiconductor devices.

BACKGROUND OF THE INVENTION

Etching processes are used to selectively remove portions of materials deposited or grown on a semiconductor wafer. After a feature is patterned on a layer formed on the semiconductor wafer using photolithographic tools and process, etching processes are used to transfer the patterned feature to materials subjacent a photoresist layer. Etching processes employed in the fabrication of semiconductor devices generally fall into two categories: wet and dry.

In either process, a layer of material, either a metallization layer or a dielectric layer, is exposed to an etchant, which chemically reacts with materials of the layer. The chemical reaction between the etchant and layer material removes an estimated predetermined portion of the layer material to form a patterned feature such as a portion of a semiconductor device. Depending on the type of etchant and etch process, the amount of layer material removed by the etchant may be controlled by reaction temperature and pressure, and etch time. During a wet etch process, the wafer on which the semiconductor device is being formed is immersed in a tank containing the etchant for a predetermined time. The device is then rinsed to remove acids, other reaction by-products and contaminants. The wafer is then dried.

Wet etch processes etch materials in all directions at substantially the same etch rate, i.e., isotropically, and are typically limited to the larger feature sizes above $3\mu$. Wet etch process tend to undercut features that require only a minimum lateral etch. Moreover, cross contamination from wafer to wafer, or batch-to-batch is an inherent problem in wet etching.

Dry etching provides an alternative to the isotropic characteristic of a wet etch process. Dry etch processes do not etch materials in a lateral direction, i.e., anistropic etch. Accordingly, dry etching is used for the fabrication of smaller features below the acceptable size limits for wet etch processes. Dry etching refers generally to those etch processes in which gases, including a plasma form, are the etch medium.

In the dry etch process, plasma-enhanced atomic species bombard the layer material to remove the estimated predetermined portion of the surface of the material. A chemical reaction, or ionic milling, takes place in a reaction chamber at sub-atmospheric pressures. One or more wafers are positioned on a platen within the reaction chamber, and an electronic bias is applied to the platen and/or wafer via an RF power source or that is induced by the plasma. In some cases, a second power source, such as an electrode or cathode coil, generates a plasma region adjacent the surface of the semiconductor device. A reactant gas introduced into the chamber is ionized within the plasma, and the resultant ions physically remove surface material of the layer by chemical reaction, or by physical bombardment, depending on the type of plasma-generating system used.

While dry etch processes provide advantages over wet etching in the fabrication of smaller features, etch selectivity in dry etch processes is difficult to control with certain materials and etching conditions. Moreover, features with higher aspect ratios cause etching to slow at the bottom of the feature; therefore, over-etching is required to clear stringers on the vertical dimension of the feature, even after the bottom of the feature is etched to desired thickness. Moreover, the plasma generating systems are expensive to purchase and maintain.

BRIEF SUMMARY OF THE INVENTION

The present invention provides a method for dry etching a semiconductor device that isoptropically etches a material on the semiconductor device. In this manner, the present method for dry etching may be used without the need for over-etching. In addition, the present invention avoids the inherent contamination problems and additional drying steps necessary in wet etching processes, and the expense of the plasma-generating systems necessary for typical dry etch processes.

As used hereinafter, the term "semiconductor device" may mean a wafer substrate (also referred to as a "device substrate") having one or more layers or films formed thereon for the fabrication of integrated circuits or may mean an individual device, such as a transistor, created by the fabrication process, depending on context. The term material as used to describe the invention shall mean any type of material deposited, and/or grown, on a wafer substrate in fabrication of the semiconductor device. Such materials may include, but are not limited to, metals, metal alloys, dielectrics, insulating materials, photoresist materials, masking materials, etc. In addition, any reference to deposition of a material shall include any method of forming a layer or film on a semiconductor device. For example, "depositing a material" may be used interchangeably with "growing a material" on a semiconductor device.

With respect to the present invention, the material is typically deposited on the device substrate in the form of a layer or film having a known thickness. In order to etch the material, a featured is patterned using photolithography processes and photoresist materials known to those skilled in the art. The semiconductor device is then positioned within a reaction chamber. A sufficient amount of the etchant gas is introduced into the reaction chamber to etch at least a portion of the material to a predetermined thickness, and consistent with the patterned feature.

The interior of the chamber is preferably maintained at a predetermined temperature and predetermined pressure to facilitate a chemical reaction between the etchant gas and material. In an exemplary embodiment, a halogen-based etchant gas may be used to remove at least a portion of a refractory metal film. The halogen-based etchant may comprise hydrogen bromide, or any one of the methyl bromide species. The refractory metal may comprise tungsten, tantalum or titanium based metal film or metal alloy film.

The present invention is distinguished from prior art dry etch procedures by the use of an etchant gas that is chemically reactive with the material without need for generating a plasma in the reaction chamber or without providing an electrical bias to the semiconductor device.

DETAILED DESCRIPTION OF THE INVENTION

In the present invention, gas phase chemistry is used in a dry etching process without the generation of a plasma or application of an electrical bias to a semiconductor device wafer to etch a material on a semiconductor device. The dry etching method may be conducted in a reaction chamber in which at least one semiconductor wafer is positioned. The reaction chamber may include chambers that are used in a chemical vapor deposition or plasma enhanced vapor deposition processes, but do not require a link to an RF power source or the use of a target coil. Such chambers typically include a vacuum pump connected to the chamber for reducing the pressure in the chamber, and resistive coils mounted within a platen upon which the semiconductor is positioned in order to heat the semiconductor device for during etching.

An etchant gas that is chemically reactive with a material deposited on the semiconductor is injected into the reaction chamber to remove at least a portion of the material from the semiconductor device. Before introduction of the etchant gas, the temperature and pressure within the chamber is adjusted to a predetermined temperature and predetermined pressure to facilitate the chemical reaction with the etchant gas and material. A sufficient amount of gas is pumped into the reaction chamber for a predetermined time to remove a portion of the material from the semiconductor device. Typically, the material is deposited or grown on the device in a layer or film to a known thickness. A predetermined amount of the material must be removed to achieve a desired thickness in the fabrication of the semiconductor device component or feature on the semiconductor device.

The amount of time to complete the etching process depends on the etch rate for a film which varies according to the chemical composition of the material to be removed and the etchant gas, and the temperature and pressure under which the chemical reaction takes place within the reaction chamber. Thus, the predetermined time for injection of the etchant is empirically determined from etching samples, or estimated from known etchant rates, which are readily available in industry texts.

In an exemplary embodiment a halogen-based etchant gas is used to remove at least a portion of a refractory metal or refractory metal alloy, such as tungsten (W) from the semiconductor device. For example hydrogen bromide (HBr) alone, or mixed with one or more species of bromomethane ($CH_3Br$), dibromomethane ($CH_2Br_2$) and bromoform ($CHBr_3$) may be pumped into the reaction chamber in which a pressure of 100 Torr to 200 Torr is maintained. The stoichiometric ratio of gases is variable to the species of methyl bromide selected but is in the range of 1:1 for $HBr/CH_3Br$; 2:1 for $HBr/CH_2Br_2$, and to 3:1 for $HBr/CHBr_3$. The ratio of gases can be adjusted during the etching process to achieve uniform optimal etch of the refractory metal from the semiconductor device. The temperature inside the reaction chamber during such etch process is in the range between about 300 to 500 degrees Celsius and can also be adjusted during the etching process. With respect to the dry etching of tungsten, the bromine in the gas mixture reacts with the tungsten to form various gaseous species of tungsten bromide, including tungsten dibromide ($WBR_2$), tungsten (IV) bromide ($WBr_4$) and tungsten (V) bromide ($WBr_5$), which are pumped from the chamber during the etch process The prior art plasma-enhanced dry etching process is facilitated by the generation of plasma within the chamber. An electrical bias to the semiconductor device controls the downward, or vertical directions of an anistropic etch. In contrast, the above described gas phase chemistry etch process provides an isotropic etch of the material from the device, which may be particularly advantageous for etching a material layer or film to a desired thickness over a feature having larger aspect ratios. The above-described invention allows for a substantially multi-directional uniform etch rate, so the material can be removed uniformly from the vertical and lateral dimensions of the feature, avoiding the need for over-etching. In other words, in an anistropic etch the effective amount of material to be etched is roughly equal to the height of a step, since etching only proceeds in a downward direction. The present inventive process allows etching to work laterally, thereby making it easier to remove unwanted parts of films over steps.

Similarly, the present invention may be used to form topographical features in a material layer, by selectively removing at least a portion of the material to form the topographical feature. After a blanket deposition of a material on a semiconductor device, one or more features may be patterned using photolithographic tools, mask layers and photoresist materials. The feature is then transferred to the material by the above described dry etch process. The material is selectively etched to a predetermined thickness; thereby forming the feature. Preferably, the gas etchant is introduced through a fixture that provides a uniform distribution of the gas etchant across the wafer or semiconductor device In addition, the above-described dry etch process may used to remove layers of films entirely from a semiconductor device. For example, a refractory metal film of a mask layer, used for feature transfer to the semiconductor device, may be removed by the above-described dry etch process.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention the following:

1. A method for dry etching a material layer deposited on a semiconductor device, the layer having a known thickness, the method comprising:
   a. positioning the semiconductor device in an etch reaction chamber;
   b. exposing the material layer to at least one etchant gas that is chemically reactive with the material of the layer, at a predetermined temperature and predetermined pressure within the reaction chamber, without generating a plasma in the reaction chamber and without providing an electrical bias to the semiconductor device, to remove at least a portion of the material layer from said semiconductor device;
   c. selecting the material layer from the group of compounds including a refractory metal and a refractory metal alloy and wherein the etchant gas comprises a halogen-based etchant gas; and
   d. selecting a halogen-based etchant gas from a group of compounds comprising hydrogen bromide, methane bromide, dibromomethane and bromoform.

2. The method of claim 1 wherein the step of exposing the material to the etchant gas comprises injecting the etchant gas into the chamber at a predetermined flow rate and for a predetermined timed duration.

3. The method of claim 1 further comprising venting of gaseous by-products, resulting from a chemical reaction between said refractory metal and said etchant, from the reaction chamber.

4. The method of claim 1 wherein the step of exposing the material layer to the etchant gas comprises etching at least a portion of the material layer to a predetermined thickness.

5. The method of claim 1 wherein the etchant gas has a known etch rate with respect to the material of the layer, and further comprising estimating a predetermined timed duration to which the material layer is exposed to the etchant gas in order to etch said material layer to a desired, substantially uniform thickness.

6. The method of claim 1 further comprising adjusting the temperature within the reaction chamber to between about 300° C. to about 500° C., before introducing the etchant gas into the reaction chamber.

7. The method of claim 1 further comprising adjusting the pressure within the reaction chamber to between about 100 Torr to about 200 Torr before introducing the etchant gas into the reaction chamber.

8. A method for fabricating a semiconductor device on a wafer substrate, comprising the steps of:
   a. depositing a material layer to a predetermined thickness over said wafer substrate;
   b. forming a mask layer for transferring a patterned feature to a material layer subjacent the mask layer, and said material forming at least one film within the mask layer;
   c. positioning the substrate within a reaction chamber; and,
   d. introducing an etchant gas into the reaction chamber at a predetermined temperature and predetermined pressure within the reaction chamber to etch at least a portion of the material layer from the substrate without generating a plasma within the chamber and without applying an electrical bias to said wafer substrate.

9. The method of claim 8 further comprising patterning a feature on a material layer of the semiconductor device, and etching a topographical feature corresponding to the patterned feature wherein the topographical feature has a substantially vertical dimension intersecting a lateral dimension forming a step therein, and the material layer having been deposited along said vertical and lateral dimensions, and said etchant gas removing at least a portion of the material layer along the vertical and lateral dimensions at substantially the same etch rate.

10. The method of claim 8 wherein said step of depositing the material comprises the blanket deposition of the material layer over the substrate and further comprising the step of patterning a feature on the device to be etched into the material layer and said step of introducing the etchant gas comprises the step of selectively removing at least a portion of the material layer to a predetermined thickness and corresponding to the patterned feature.

11. A method for dry etching a refractory metal film formed over a wafer substrate of a semiconductor device, and said refractory metal film having a known thickness, comprising the steps of:
   a. positioning the wafer substrate within a reaction chamber;
   b. isotropically etching at least a portion of the refractory metal film to a predetermined thickness by introducing at least one halogen-based etchant gas into the reaction chamber at a predetermined temperature and predetermined pressure within the reaction chamber, without generating a plasma within the chamber or applying an electrical bias to the wafer substrate; and;
   c. selecting the halogen-based etchant gas from a group of compounds comprising hydrogen bromide, methane bromide, dibromomethane and bromoform.

12. The method of claim 11 comprising adjusting the temperature to said predetermined temperature within the reaction chamber from about 300° C. to about 500° C., before introducing the etchant gas into the reaction chamber.

13. The method of claim 11 further comprising adjusting the pressure within the reaction chamber to said predetermined pressure from about 100 Torr to about 200 Torr, before introducing the etchant gas into the reaction chamber.

14. A method for dry etching a refractory metal film formed over a wafer substrate of a semiconductor device, and said refractory metal film having a known thickness, comprising the steps of:
   a. positioning the wafer substrate within a reaction chamber; and,
   b. isotropically etching at least a portion of the refractory metal film to a predetermined thickness by introducing at least one gaseous compound having at least one brominated methyl group into the reaction chamber at a predetermined temperature and predetermined pressure within the reaction chamber, without generating a plasma within the chamber or applying an electrical bias to the wafer substrate.

15. The method of claim 14 further comprising the step of selecting the gaseous compound from a group of compounds comprising hydrogen bromide, methane bromide, dibromomethane and bromoform.

* * * * *